United States Patent
Dang et al.

(10) Patent No.: US 12,417,874 B2
(45) Date of Patent: Sep. 16, 2025

(54) SIGNAL TRANSMISSION DEVICE

(71) Applicants: Kabushiki Kaisha Toshiba, Tokyo (JP); Toshiba Electronic Devices & Storage Corporation, Tokyo (JP)

(72) Inventors: Bowen Dang, Kawasaki Kanagawa (JP); Takeshi Murasaki, Yokohama Kanagawa (JP); Takaya Kitahara, Yokohama Kanagawa (JP); Makoto Arai, Tachikawa Tokyo (JP); Shoji Ootaka, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 292 days.

(21) Appl. No.: 18/181,929

(22) Filed: Mar. 10, 2023

(65) Prior Publication Data
US 2024/0096542 A1    Mar. 21, 2024

(30) Foreign Application Priority Data
Sep. 21, 2022   (JP) .................. 2022-150555

(51) Int. Cl.
*H01F 27/28*   (2006.01)
*H05K 1/11*    (2006.01)
*H05K 1/18*    (2006.01)

(52) U.S. Cl.
CPC ......... *H01F 27/2804* (2013.01); *H05K 1/115* (2013.01); *H05K 1/181* (2013.01)

(58) Field of Classification Search
CPC ..... H01F 27/2804; H05K 1/115; H05K 1/181
(Continued)

(56) References Cited

U.S. PATENT DOCUMENTS 7,994,890 B2   8/2011   Edo et al.
8,704,627 B2   4/2014   Kuroda
(Continued)

FOREIGN PATENT DOCUMENTS

JP   5076725 B2   11/2012
JP   5252486 B2   7/2013
(Continued)

OTHER PUBLICATIONS

Notice of Reasons for Refusal (Office Action) mailed Jul. 11, 2025 in counterpart Japanese Patent Application No. 2022-150555, with English machine translation, 6 pages.

*Primary Examiner* — Andargie M Aychillhum
(74) *Attorney, Agent, or Firm* — Kim & Stewart LLP

(57) ABSTRACT

A signal transmission device according to the embodiment includes: a first integrated circuit chip provided with a first coil that constitutes the isolation transformer; a printed circuit board provided with a second coil that is magnetically coupled with the first coil to form the insulating transformer; a second integrated circuit chip having a first connection terminal and a second connection terminal provided on the upper surface; a first wire that electrically connects between one end of the second coil and the first connection terminal; and a second wire that electrically connects between the other end of the second coil and the second connection terminal, wherein the second coil is provided only in the wiring layer of the printed circuit board, which has a single wiring layer structure.

10 Claims, 6 Drawing Sheets

(58) Field of Classification Search
USPC .......................................................... 361/782
See application file for complete search history.

(56) References Cited

U.S. PATENT DOCUMENTS

| | | | |
|---|---|---|---|
| 9,071,288 B2 | 6/2015 | Yamaguchi | |
| 9,761,545 B2 | 9/2017 | Sin et al. | |
| 12,142,411 B2 | 11/2024 | Nega et al. | |
| 2007/0205748 A1* | 9/2007 | Abou ....................... | H04B 5/73 |
| | | | 324/100 |
| 2016/0232838 A1* | 8/2016 | Seo .......................... | G09G 3/20 |

FOREIGN PATENT DOCUMENTS

| | | | |
|---|---|---|---|
| JP | 2014022600 A | 2/2014 |
| JP | 5852432 B2 | 2/2016 |
| JP | 2017538277 A | 12/2017 |
| JP | 2021150839 A | 9/2021 |

* cited by examiner

ND PATENT NO. 12,417,874 B2

SIGNAL TRANSMISSION DEVICE

CROSS-REFERENCE TO RELATED APPLICATIONS

This application is based upon and claims the benefit of priority from the prior Japanese Patent Application No. 2022-150555, filed on Sep. 21, 2022, the entire contents of which are incorporated herein by reference.

FIELD

This embodiment relates to a signal transmission device.

BACKGROUND

Conventionally, for example, some signal transmission devices such as the LVDS (Low-Voltage Differential Signaling) system include an isolation transformer, which is a magnetically coupled isolator used for electrical isolation.

Then, for example, in an isolation transformer that uses the wiring layer of an integrated circuit (IC) chip, a so-called on-chip transformer, if it is necessary to satisfy a predetermined dielectric strength voltage, it is necessary to adopt a double insulation structure in which multiple transformers are connected in series, instead of a single insulation structure.

In addition, since the dielectric strength of such a chip interlayer film depends on the reliability of the manufacturing process, the degree of freedom is low, and the manufacturing process for improving the dielectric strength leads to an increase in cost.

Also, for example, an insulation transformer that uses a printed circuit board (PCB) can ensure a desired dielectric breakdown voltage even with a single insulation structure if the insulation material and the thickness of the insulation layer are appropriately selected. However, in the printed wiring board, multi-layer wiring is essential, and since there are many restrictions such as via diameter, miniaturization of wiring becomes difficult.

DETAILED DESCRIPTION

An object of one embodiment is to provide a signal transmission device capable of miniaturizing wiring while improving dielectric strength.

The signal transmission device provided with an isolation transformer, the signal transmission device includes:
a first integrated circuit chip provided with a first coil that constitutes the isolation transformer;
a printed circuit board provided with a second coil that is magnetically coupled with the first coil to form the insulating transformer;
a second integrated circuit chip having a first connection terminal and a second connection terminal provided on the upper surface;
a first wire that electrically connects between one end of the second coil and the first connection terminal; and
a second wire that electrically connects between the other end of the second coil and the second connection terminal,
wherein the printed circuit board has only one wiring layer, and
wherein the second coil is provided only in the wiring layer of the printed circuit board, which has a single wiring layer structure.

The signal transmission device according to the embodiment will be described in detail below with reference to the accompanying drawings. In addition, the present invention is not limited by these embodiments.

First Embodiment

[Signal Transmission Device]

Figure 1:
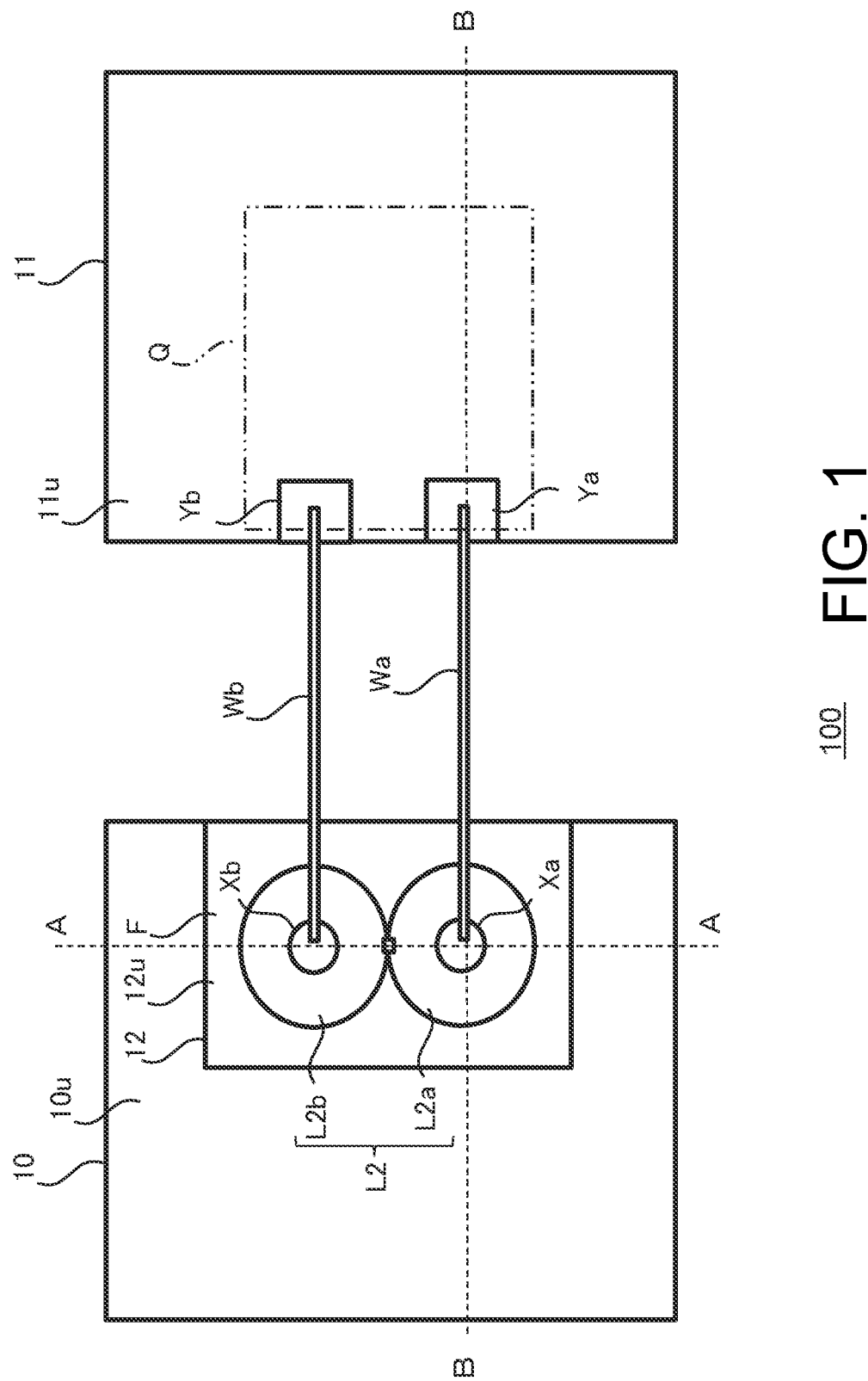
FIG. 1 is a top view showing an example of a schematic configuration of the signal transmission device according to the first embodiment.
Figure 2:
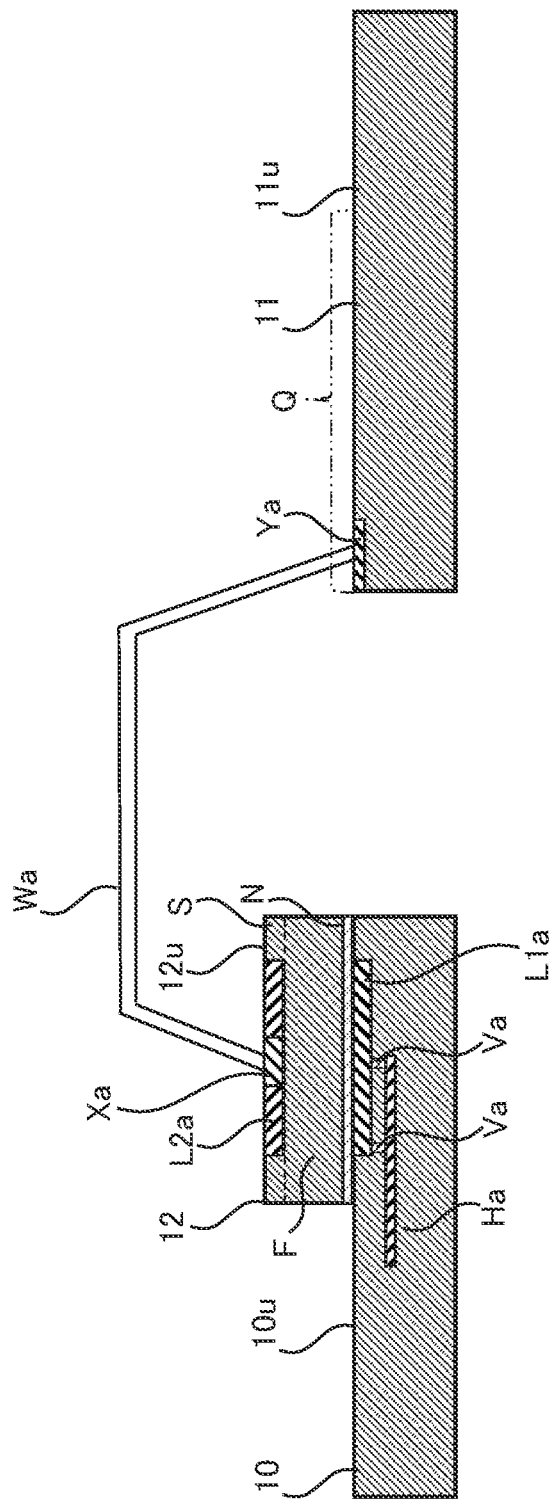
FIG. 2 is a cross-sectional view showing an example of a schematic cross-section of the signal transmission device along line A-A shown in FIG. 1.
Figure 3:
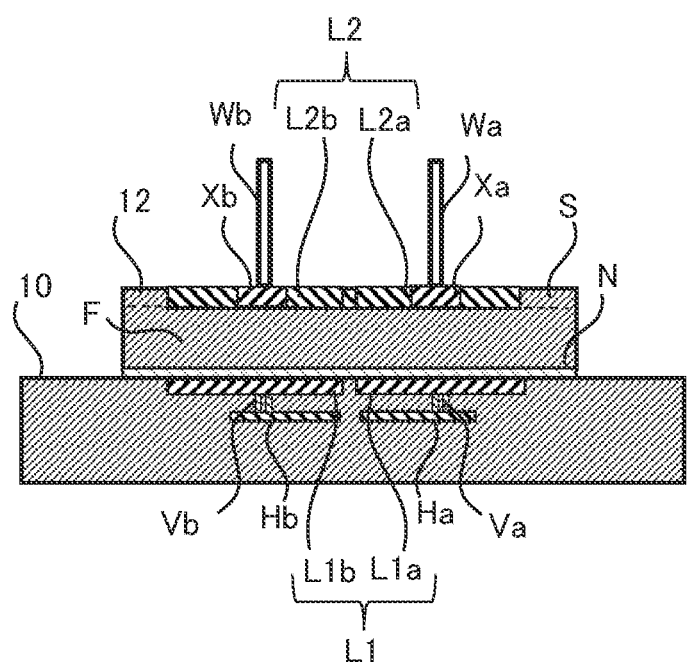
FIG. 3 is a cross-sectional view showing an example of a schematic cross-section of the signal transmission device along line B-B shown in FIG. 1.
Figure 4:
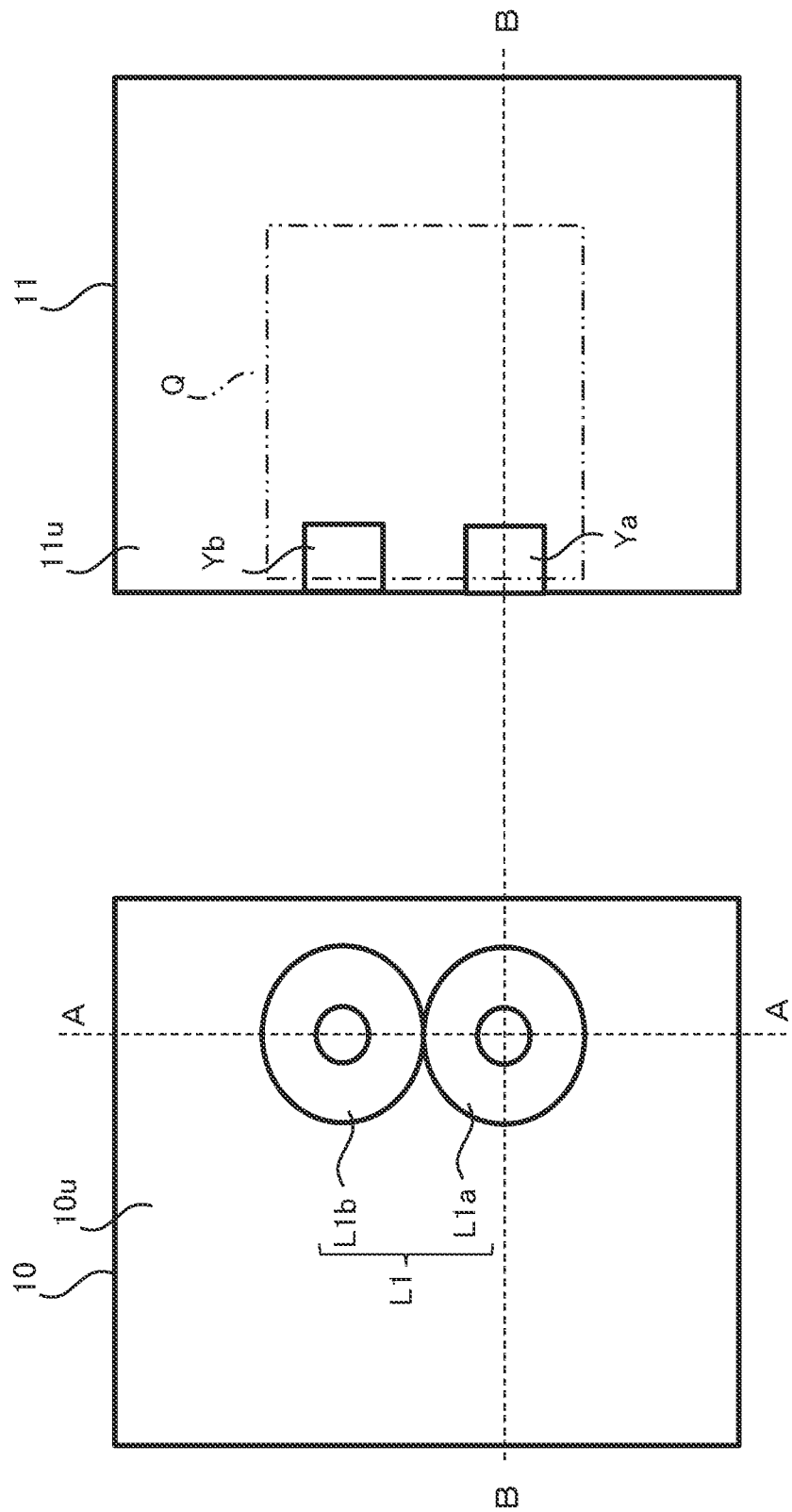
FIG. 4 is a top view showing an example of a schematic configuration of the integrated circuit chip of the signal transmission device shown in FIG. 1.
Figure 5:
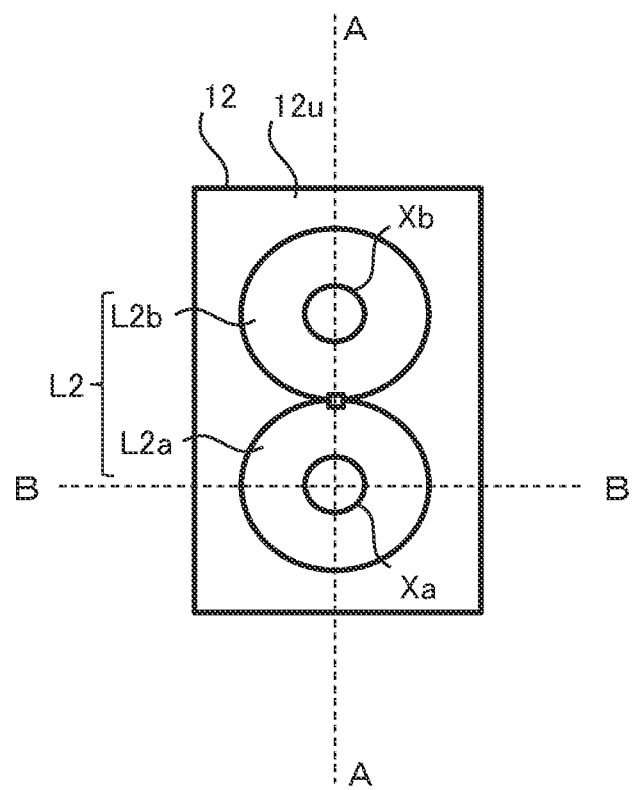
FIG. 5 is a top view showing an example of a schematic configuration of the circuit board of the signal transmission device shown in FIG. 1.
Figure 6:
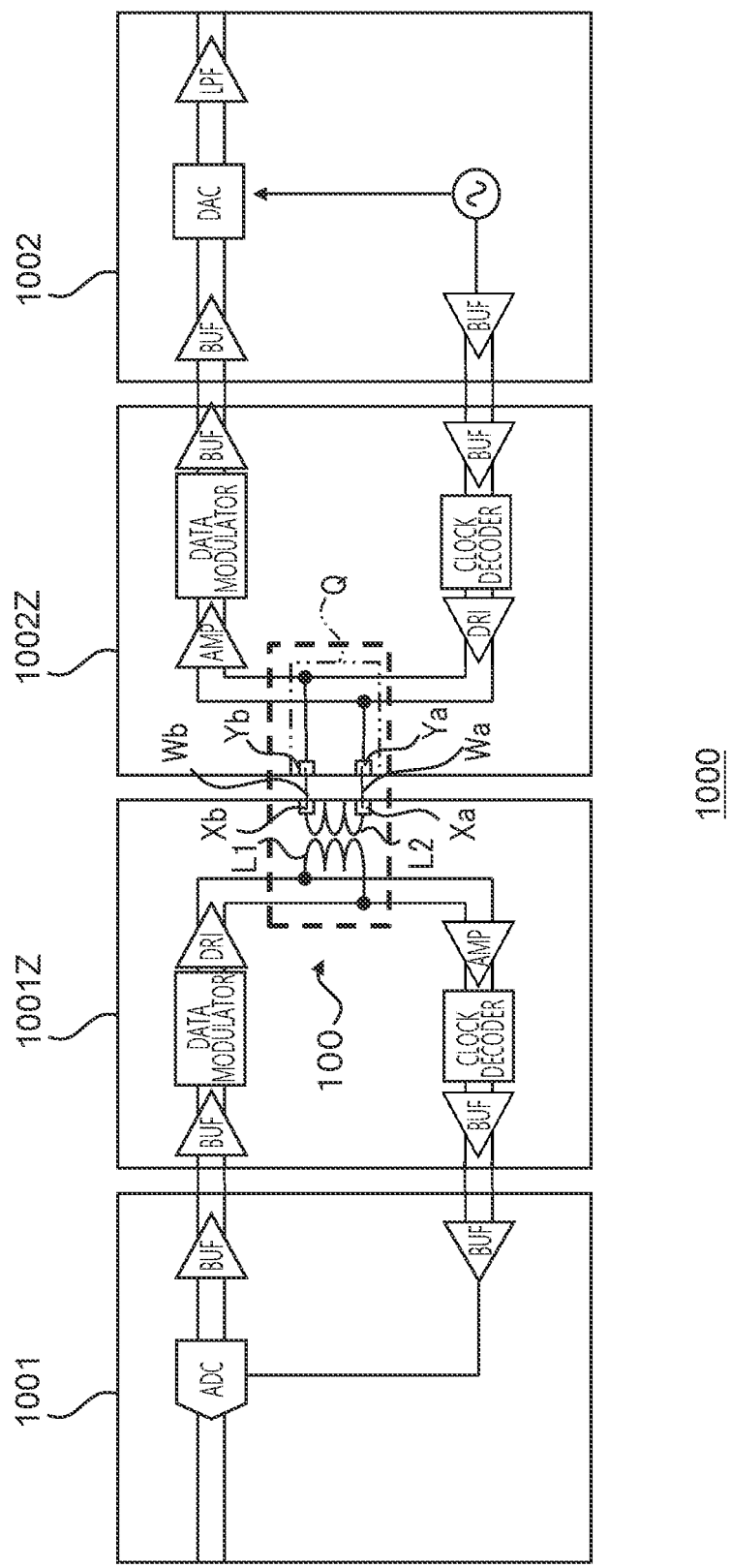
FIG. 6 is a diagram showing an example of the configuration of a signal transmission system to which the signal transmission device according to the first embodiment is applied.

FIG. 1 is a top view showing an example of a schematic configuration of the signal transmission device according to the first embodiment. FIG. 2 is a cross-sectional view showing an example of a schematic cross-section of the signal transmission device along line A-A shown in FIG. 1. FIG. 3 is a cross-sectional view showing an example of a schematic cross-section of the signal transmission device along line B-B shown in FIG. 1. FIG. 4 is a top view showing an example of a schematic configuration of the integrated circuit chip of the signal transmission device shown in FIG. 1. FIG. 5 is a top view showing an example of a schematic configuration of the circuit board of the signal transmission device shown in FIG. 1. FIG. 6 is a diagram showing an example of the configuration of a signal transmission system to which the signal transmission device according to the first embodiment is applied.

It should be noted that each structure of the signal transmission device 100 shown in FIGS. 1 to 5 is schematically shown, some of their configurations and positional relationships may be simplified or omitted, and their sizes may differ from the actual ones.

The signal transmission device 100 according to the first embodiment is a signal transmission device provided with an isolation transformer of a magnetic coupling type isolator used for electrical separation of high-voltage and low-voltage circuits.

The signal transmission device 100 according to the first embodiment includes, for example, as shown in FIGS. 1 to 3, a first integrated circuit chip 10; a second integrated circuit chip 11; a printed circuit board (PCB) 12; a first wire Wa; a second wire Wb; and an adhesive layer N.

These components of the signal transmission device 100 are molded with resin (not shown), for example.

[First Integrated Circuit Chip]

The first integrated circuit chip 10 is provided with a first coil (primary winding) L1 that constitutes the isolation transformer.

For example, as shown in FIGS. 1 to 4, the first integrated circuit chip 10 includes the first coil (primary winding) L1, signal wirings Ha and Hb, and via hole wirings Va and Vb. Although the first coil L1 is not shown in FIG. 1, The first coil L1 is illustrated in FIGS. 2-4.

The first coil L1 is provided close to the upper surface $10u$ of the first integrated circuit chip 10.

The first coil L1 has a structure configured in one wiring layer of the first integrated circuit chip 10 in the examples of FIGS. The first coil L1 is made of copper, for example.

The configuration of the first coil L1 that constitutes the isolation transformer shown in FIGS. 2 to 4 is, for example, a spiral winding and includes two primary coils Lia and Lib. and may consist of a single winding or a plurality of further divided windings.

The signal wiring Ha is provided so as to extend in the horizontal direction on a lower wiring layer different from the upper wiring layer on which the primary coil Lia constituting the first coil L1 is provided. This signal wiring Ha is electrically connected to an integrated circuit (not shown) provided in the first integrated circuit chip 10.

Also, the via-hole wiring Va is provided so as to extend in the vertical direction between the primary coil Lia constituting the first coil L1 and the signal wiring Ha. The via-hole wiring Va electrically connects the primary coil $1a$ constituting the first coil L1 and the signal wiring Ha.

The signal wiring Hb is provided so as to extend in the lateral direction on a lower wiring layer different from the upper wiring layer on which the primary coil Lib constituting the first coil L1 is provided. This signal wiring Hb is electrically connected to an integrated circuit (not shown) provided in the first integrated circuit chip 10.

Also, the via-hole wiring Vb is provided so as to extend in the vertical direction between the primary coil Lib forming the first coil L1 and the signal wiring Hb. The via-hole wiring Vb electrically connects the primary coil $1b$ forming the first coil L1 and the signal wiring Hb.

[Printed Circuit Board]

For example, as shown in FIGS. 2 and 3, the printed wiring board 12 has only one wiring layer S which is a single-layer wiring structure (not a multilayer structure) as a layer for arranging wiring.

For example, as shown in FIGS. 1 to 4, the printed circuit board 12 includes a film substrate F, a second coil (secondary winding) L2, a first coil terminal Xa, and a second coil terminal Xb.

The film substrate F has a plate-like shape extending in the lateral direction, as shown in FIGS. 1 to 4, for example. The second coil L2 is provided on the upper surface of this film substrate F.

This film substrate F has insulation necessary for a magnetic coupling type isolator used for electrical isolation. The film substrate F is made of resin such as polyimide, for example. However, the material constituting the film substrate F can be selected from materials having other insulating properties, and the degree of freedom of selection as the insulating material constituting the insulation transformer is high.

Also, for example, as shown in FIGS. 1 to 4, the second coil L2 is provided as a secondary winding for forming the isolation transformer by magnetically coupling with the first coil L1, which is the primary winding. The second coil L2 is composed of a wire wound in the lateral direction in a wiring layer S located on the upper surface $12u$ of the printed circuit board 12 and extending in the lateral direction.

In particular, the second coil L2 is provided only in the wiring layer S in this embodiment. More specifically, the second coil L2 is configured to extend in the lateral direction and be wound on the wiring layer S of the printed circuit board 12.

In this way, it is possible to miniaturize the wiring by configuring the winding with only one layer of wiring. That is, since the second coil L2 can be miniaturized in the wiring layer S of the printed circuit board 12, the insulating transformer can be configured with a smaller area.

In the examples of FIGS. 2 and 3, the printed circuit board 12 is fixed above the first integrated circuit 10 so that the second coil L2 is arranged above the first coil L1.

Thus, in this embodiment, the second coil is a winding having a spiral shape. The second coil L2 is made of copper, for example.

The second coil L2 includes, for example, a secondary coil $L2a$ and a secondary coil $L2b$, as shown in FIGS. 1 to 4.

The secondary coil $L2a$ and the secondary coil $L2b$ are provided in a substantially FIG. 8 shape on the wiring layer S, as shown in FIGS. 1 and 4, for example.

It should be noted that, as shown in FIGS. 1 to 3 and 5, the configuration of the second coil L2 that constitutes the isolation transformer is a winding formed in a spiral shape as described above, and includes secondary coils $L2a$ and $L2b$ that are provided in a substantially figure-eight shape. However, the configuration of the second coil L2 may have a different shape, or may be divided and configured with a plurality of windings.

Also, the first coil terminal Xa is provided in the wiring layer S and connected to one end (secondary coil $L2a$) of the second coil L2, as shown in FIGS. 1 to 4, for example. In the example of FIGS. 1 to 4, the first coil terminal Xa is arranged at the center of the spiral secondary coil $L2a$.

Also, the second coil terminal Xb is provided on the wiring layer S and connected to the other end (secondary coil $L2b$) of the second coil L2. In the example of FIGS. 1 to 4, the second coil terminal Xb is arranged at the center of the spiral secondary coil $L2b$.

[Second Integrated Circuit Chip]

The second integrated circuit chip 11, for example, as shown in FIGS. 1, 2, and 4, has a first connection terminal Ya and a second connection terminal Yb provided on the upper surface $11u$. In the examples shown in FIGS. 2 and 4, in the second integrated circuit chip 11, wirings and integrated circuits connected to the first connection terminal Ya and the second connection terminal Yb are omitted.

Here, for example, as shown in FIGS. 1, 2, and 4, in the second integrated circuit chip 11, no insulating transformer is arranged in the area Q between the first connection terminal Ya, the second connection terminal Yb and the integrated circuit (amplifier or driver), provided in the second integrated circuit chip 11 and electrically connected to the first connection terminal Ya and the second connection terminal Yb.

As a result, the chip size of the second integrated circuit chip 11 can be reduced.

[First Wire]

The first wire Wa electrically connects between one end of the second coil L2 and the first connection terminal Ya.

More specifically, the first wire Wa has one end connected to the first coil terminal Xa (the one end is connected to one end of the second coil L2 via the first coil terminal Xa) and has the other end connected to the first connection terminal Ya.

Note that the first wire Wa is a bonding wire, and is made of metal such as gold, silver, or aluminum, for example.

[Second Wire]

The second wire Wb electrically connects the other end of the second coil L2 and the second connection terminal Yb.

More specifically, the second wire Wb has one end connected to the second coil terminal Xb (the one end is connected to the other end of the second coil L2 via the second coil terminal Xb), and has the other end connected to the second connection terminal Yb.

The second wire Wb is a bonding wire, and is made of metal such as gold, silver, and aluminum.

[Adhesion Layer]

For example, as shown in FIGS. 2 and 3, the adhesion layer N is located between the upper surface 10u of the first integrated circuit chip 10 and the lower surface of the printed circuit board 12. The adhesion layer N adheres (fixes) the first integrated circuit chip 10 and the printed circuit board 12 together.

In particular, in the examples of FIGS. 2 and 3, the printed circuit board 12 is fixed above the first integrated circuit 10 by the adhesion layer N so that the second coil L2 is arranged above the first coil L1.

This adhesion layer N is composed of, for example, a silicone adhesive. However, as the material forming the adhesion layer N, other insulating adhesives can be selected, and the degree of freedom of selection as the insulating material forming the isolation transformer is high.

The signal transmission device 100 having the above configuration is configured, by connecting the first and second coil terminals Xa and Xb of the printed circuit board 12 and the first and second connection terminals Ya and Yb of the second integrated circuit chip 11 with the first and second wires Wa and Wb, by wire bonding, after placing and fixing the printed circuit board 12 on the first integrated circuit chip 10 via the adhesion layer N.

That is, in the signal transmission device 100, the isolation transformer is configured, by bonding the first integrated circuit chip 10, provided with a primary-side first coil L1 constituting an isolation transformer, and the printed circuit board 12, provided with a second coil L2 on the secondary side that constitutes the insulating transformer, together.

Therefore, the chip manufacturing process for forming the isolation transformer between the first integrated circuit chip 11 and the printed circuit board 12 does not require a manufacturing process with a high withstand voltage, thus reducing the manufacturing cost, moreover, it is possible to improve the degree of freedom in selecting the manufacturing process.

Furthermore, as described above, the signal transmission device 100 according to the present embodiment enables miniaturization of wiring, so that the number of turns can be increased to increase the inductance/coupling coefficient.

Furthermore, since the signal transmission device 100 according to the present embodiment can reduce the area of the winding region, the manufacturing cost can be reduced, and EMC (Electromagnetic Compatibility), EMI (Electromagnetic Interference), EM (Electromagnetic Interference), characteristics such as electromagnetic susceptibility) can be improved.

As described above, according to the signal transmission device 100 according to the present embodiment, it is possible to achieve miniaturization of wiring while improving the dielectric strength.

[Signal Transmission System]

Here, an example of the configuration of a signal transmission system to which the signal transmission device according to the first embodiment described above is applied will be described. FIG. 6 is a diagram showing an example of the configuration of a signal transmission system to which the signal transmission device is applied. In the following description, among the components shown in FIG. 6, the description of the same components as those shown in FIGS. 1 to 5 may be omitted, by attaching the same reference numerals as those shown in FIGS. 1 to 5.

As shown in FIG. 6, the signal transmission system 1000 transmits an input signal and outputs output signals OUTP and OUTN.

For example, as shown in FIG. 6, this signal transmission system 1000 includes a signal primary circuit (semiconductor chip) 1001 to which input signals INP and INN are input, an insulated primary circuit (semiconductor chip) 1001Z that transmits signals to and from the signal primary circuit 1001, a signal secondary circuit (semiconductor chip) 1002 that outputs output signals OUTP and OUTN, and an insulating secondary circuit (semiconductor chip) 1002Z that transmits signals to and from the signal secondary circuit 1002.

Then, as shown in FIG. 6, between the isolated primary circuit 1001Z and the isolated secondary circuit 1002Z, the signal transmission device 100 according to the first embodiment having an electrically isolated isolation transformer structure is applied, therefore, the signal is transmitted by this signal transmission device 100.

Here, for example, as shown in FIG. 6, in the insulated secondary circuit 1002Z (corresponding to the second integrated circuit chip 11 of the signal transmission device 100), the first connection terminal Ya and the second connection terminal Yb and the integrated circuit (amplifiers and drivers) are connected by wiring, and no isolation transformer is arranged in the region Q between them.

Therefore, the chip size of the isolated secondary circuit 1002Z (corresponding to the second integrated circuit chip 11 of the signal transmission device 100) can be reduced.

In addition, as described above, since the signal transmission device 100 according to the first embodiment is capable of improving the dielectric strength and miniaturizing the wiring, the signal transmission system 1000 to which these signal transmission devices are applied also, the wiring can be miniaturized while improving the withstand voltage.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A signal transmission device provided with an isolation transformer, comprising:
   a first integrated circuit chip provided with a first coil that constitutes the isolation transformer;
   a printed circuit board provided with a second coil that is magnetically coupled with the first coil to form the insulating transformer;
   a second integrated circuit chip having a first connection terminal and a second connection terminal provided on the upper surface;
   a first wire that electrically connects between one end of the second coil and the first connection terminal; and a second wire that electrically connects between the other end of the second coil and the second connection terminal, wherein the printed circuit board has only one wiring layer, and wherein the second coil is provided only in the wiring layer of the printed circuit board, which has a single wiring layer structure.

2. The signal transmission device according to claim 1, wherein the second coil includes a winding wound in the lateral direction in the wiring layer located on the upper surface of the printed circuit board and extending in the lateral direction.

3. The signal transmission device according to claim 1, wherein the first integrated circuit chip includes:

a signal wiring provided in a lower wiring layer different from the upper wiring layer provided with the first coil and electrically connecting the integrated circuit provided in the first integrated circuit chip and the first coil, and a via-hole wiring provided between the first coil and the signal wiring and electrically connecting the first coil and the signal wiring.

4. The signal transmission device according to claim 2, wherein the first integrated circuit chip includes:

a signal wiring provided in a lower wiring layer different from the upper wiring layer provided with the first coil and electrically connecting the integrated circuit provided in the first integrated circuit chip and the first coil, and a via-hole wiring provided between the first coil and the signal wiring and electrically connecting the first coil and the signal wiring.

5. The signal transmission device according to claim 1, wherein the signal transmission device further comprises an adhesion layer positioned between the top surface of the first integrated circuit chip and the bottom surface of the printed circuit board and adhering the first integrated circuit chip and the printed circuit board.

6. The signal transmission device according to claim 2, wherein the signal transmission device further comprises an adhesion layer positioned between the top surface of the first integrated circuit chip and the bottom surface of the printed circuit board and adhering the first integrated circuit chip and the printed circuit board.

7. The signal transmission device according to claim 1, wherein the printed circuit board is fixed above the first integrated circuit so that the second coil is arranged above the first coil.

8. The signal transmission device according to claim 2, wherein the printed circuit board is fixed above the first integrated circuit so that the second coil is arranged above the first coil.

9. The signal transmission device according to claim 1, wherein the printed circuit board has an insulating film substrate, and wherein the second coil is provided on the upper surface of the film substrate.

10. The signal transmission device according to claim 2, wherein the printed circuit board has an insulating film substrate, and wherein the second coil is provided on the upper surface of the film substrate.

* * * * *